United States Patent
Ricotti et al.

[19]

[11] Patent Number: 5,854,481
[45] Date of Patent: Dec. 29, 1998

[54] ELECTRONIC CORD AND CIRCUIT WITH A SWITCH FOR MODIFYING THE RESONANT FREQUENCY OF A RECEIVER

[75] Inventors: Giulio Ricotti, Broni; Roberto Bardelli, Milan; Domenico Rossi, Cilavegna (Pavia), all of Italy

[73] Assignee: SGS-Thomson Microelectronics, S.r.l., Agrate Brianza, Italy

[21] Appl. No.: 688,830

[22] Filed: Jul. 31, 1996

[30] Foreign Application Priority Data

Jul. 31, 1995 [EP] European Pat. Off. ............ 95830342

[51] Int. Cl.⁶ ................................................. G06K 19/06
[52] U.S. Cl. ........................................... 230/492; 235/380
[58] Field of Search ................................ 235/375, 380, 235/382, 492, 493; 327/337

[56] References Cited

U.S. PATENT DOCUMENTS

| | | | |
|---|---|---|---|
| 4,438,354 | 3/1984 | Haque et al. ................ | 327/337 X |
| 4,580,041 | 4/1986 | Walton . | |
| 4,818,855 | 4/1989 | Mongeon .................... | 235/492 X |
| 4,899,069 | 2/1990 | Nicollini .................... | 327/337 X |
| 4,918,416 | 4/1990 | Walton et al. ............. | 235/492 X |
| 4,924,189 | 5/1990 | Sehn et al. ................. | 327/337 X |
| 5,099,227 | 3/1992 | Geiszler et al. ............ | 235/440 X |
| 5,349,173 | 9/1994 | Scheckel et al. ........... | 235/492 |
| 5,382,952 | 1/1995 | Miller ......................... | 235/440 X |
| 5,479,130 | 12/1995 | McCartney ................. | 327/337 X |
| 5,514,997 | 5/1996 | Quinn .......................... | 327/337 |
| 5,652,423 | 7/1997 | Saitoh et al. ................ | 235/492 |

FOREIGN PATENT DOCUMENTS

| | | |
|---|---|---|
| 0525642 | 10/1993 | European Pat. Off. . |
| 0596124 | 4/1994 | European Pat. Off. . |
| 0376551 | 7/1995 | European Pat. Off. . |
| 0168840 | 4/1996 | European Pat. Off. . |
| 4200775 | 5/1993 | Germany . |
| 2212684 | 7/1989 | United Kingdom . |
| 8901672 | 2/1989 | WIPO . |

*Primary Examiner*—Anita Pellman Gross
*Assistant Examiner*—Karl Frech
*Attorney, Agent, or Firm*—David V. Carlson; Robert E. Mates; Seed and Berry

[57] ABSTRACT

A circuit for modifying a resonant frequency of a receiver for radio frequency signals. The receiver includes an inductor connected in parallel with a capacitor. The circuit includes a switch having an additional capacitor connected between two MOS transistors, the switch being connected in parallel with the receiver to add capacitance based on a control of the MOS transistors.

34 Claims, 5 Drawing Sheets

5,854,481

ELECTRONIC CORD AND CIRCUIT WITH A SWITCH FOR MODIFYING THE RESONANT FREQUENCY OF A RECEIVER

TECHNICAL FIELD

The present invention relates to an electrically controlled switch of the type designed to switch variable polarity signals and to an electronic card using it.

BACKGROUND OF THE INVENTION

Switching bipolar electrical signals, especially if no great restrictions are placed on the magnitude of said signals, is not a simple problem to resolve especially if simple circuitry solutions are being sought.

The problem becomes more complicated if the switch is to be made in integrated form since the problems tied to the polarity of the substrate and the process wells must be faced at the same time.

A switch of this type is necessary e.g. in electronic cards and in particular in those of the type without contact. This type of card and its possible operation are described e.g. in patent application EP 0 602 449. This card calls for switching of a load connected in parallel to a resonating circuit generally provided by connection in parallel of a coil and a capacitor. In patent application EP 0 602 448, which is related to the foregoing is illustrated load switching control. A production method for a card of this type is also shown in patent application EP 0 587 011.

SUMMARY OF THE INVENTION

These electronic cards perform their data memorization, reception and/or transmission function when they are coupled to a base station capable of transmitting and/or receiving radio-frequency signals whether modulated or unmodulated. FIG. 1 shows an entire transmission system where BS indicates the base station and BC a coil used by the station BS as an antenna, SC indicates the electronic card and CC indicates a coil used in the card SC as an antenna, which constitutes together with a capacitor C1 the resonant circuit while the rest of the circuitry is preferably provided in one or more integrated circuits. If the capacitance of the capacitor C1 is not too high, it too can be advantageously integrated. When the two coils BC and CC are very near in comparison with the wavelength of the radio-frequency signal the coil behavior can be assimilated with that of a transformer and it is also possible to transfer electrical signals between the station BS and the card SC.

Through the resonant circuit energy is received in the form of an unmodulated radio-frequency signal for operation of the card (this energy must allow operation of the card during a time period sufficient for data reception and/or transmission), a modulated radio-frequency signal bearing data of interest for the card is received and an unmodulated radio-frequency signal for data transmission by the card is received.

Transmission by the card takes place in the following manner. The resonant circuit of the card SC is normally tuned on the transmission frequency of the station BS. If the resonant circuit parameters are changed, the station BS can notice it because this change will lead to changes in the current circulating and/or in the voltage developed at the ends of the coil BC in a manner similar to what takes place on the primary winding of a transformer when the load connected to its secondary winding changes, for example. If the changes in the resonance parameters are made by the circuitry included in the card SC in a rhythmic manner following a data signal, the station BS will be able to "receive" these data "transmitted" by the card SC.

The purpose of the present invention is to supply a circuit solution for an electrically controlled bipolar switch suited in particular for integration.

The purpose is achieved by means of a switch having the characteristics set forth in the various independent claims while further advantageous aspects of the present invention are set forth in the dependent claims.

The present invention also relates to an integrated circuit and an electronic card in which the switch in accordance with the present invention finds advantageous application.

The switch in accordance with the present invention comprises two MOS transistors whose main conduction paths are connected respectively upstream and downstream of the terminals of the network whose electrical connection it is desired to control electrically. In this manner current can flow in the network only if both the transistors are in conduction.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 2:
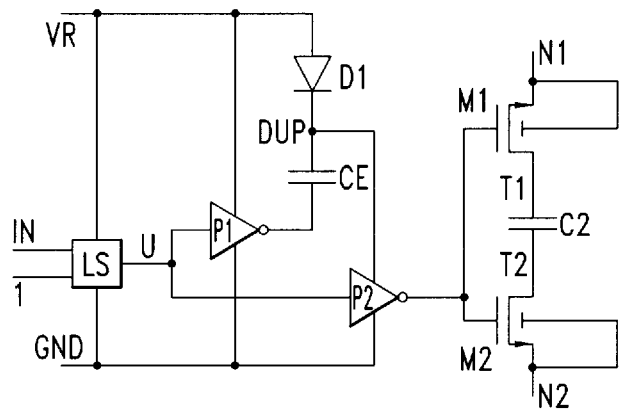
FIG. 2 shows a circuit diagram of a switch in accordance with an embodiment of the present invention.

The numerous innovative teachings of the present application will be described with particular reference to the presently preferred embodiment (by way of example, and not of limitation), in which:

The switch in accordance with the present invention is the type designed to couple a first and a second terminal of a first electrical network respectively to a first and a second node of a second electrical network. With reference to FIG. 2 the first terminal is indicated by T1, the second terminal by T2, the first node by N1 and the second node by N2. The first electrical network consists of a two-terminal circuit element and specifically a capacitor C2, the second electrical network is not shown.

The switch of FIG. 2 comprises basically a first MOS transistor M1 having a main conduction path connected between the node N1 and the terminal T1 and a second MOS transistor M2 having a main conduction path connected between the node N2 and the terminal T2.

So that current can flow in the capacitor C2 it is necessary that both the transistors M1 and M2 be conducting independently of the potentials assumed by the nodes N1, N2 and the terminals T1, T2. Consequently their voltages VGS must be higher that the corresponding threshold voltages. So that current may not flow it is sufficient that one of the two transistors M1, M2 be off and naturally better yet if both are off because in this manner any kind of flow even transient of charges from or to the network connected to the switch will be prevented.

In the switch of FIG. 2 the transistors M1 and M2 have a channel of the same type of conductivity (N channel) and have their control terminals connected together. In this manner it is possible to control the switch with a single electrical signal of logical type.

To determine the potentials corresponding to the high and low logic states which permit correct and optimal operation of the switch it suffices to find the maximum and minimum potentials assumed by the nodes N1, N2 during operation of the system made up of the two networks and the switch, set the high value at least higher than the threshold voltage at the greater of the maxima, and set the smaller low value at the difference between the smaller of the minima and the threshold voltage.

With these settings both the transistors are simultaneously in conduction or interdiction.

In the circuit of FIG. 2 the transistors M1 and M2 have their body terminals connected to the respective source terminals, to avoid undesired conduction across the parasitic junctions associated with the MOS transistors.

Apart from the type of MOS transistors and how they are connected the switch needs a network for driving them which must be powered.

Such a network can be included in the switch control circuitry or in the switch itself. If the control circuitry is included in the first or second network it is very appropriate to power both the drive circuitry and the first and/or second network by means of the same power supply reference.

The drive network must generate logical signals of appropriate level. If the positive power supply potential is less that the high level or if the negative power supply potential is higher than the low level it is necessary to provide a voltage booster circuit in the drive network.

The drive network of FIG. 2 is very well suited to use in electronic cards as clarified below and consists of a level shifter LS having a logical output U and two mutually reversed logical inputs I and IN, a first inverter P1, a second inverter P2, a storage capacitor CE and a diode D1. The network is connected to a power supply reference VR and a ground reference GND.

The inputs of the shifter LS correspond to the inputs of the drive network. Generally it is not necessary to have two mutually reversed logical signals for a level shifter. Naturally, if the particular topology of the shifter requires it, both signals can be supplied from the outside or one of them can be generated internally from the other using an inverter.

Figure 4:
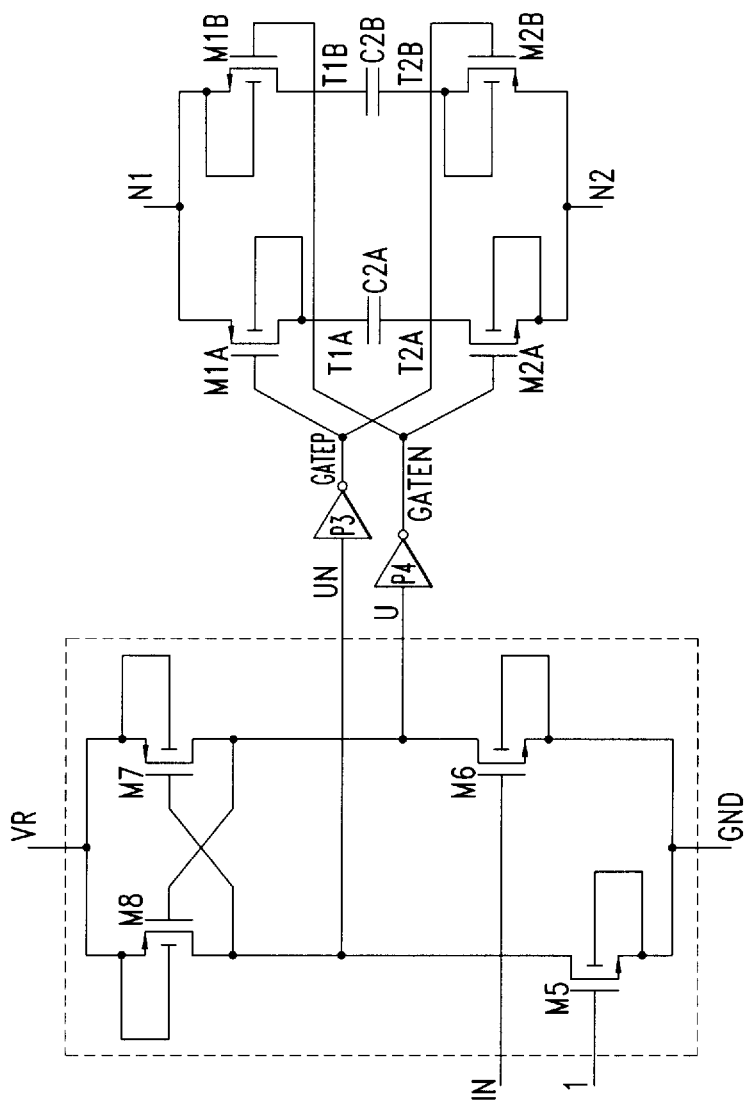
FIG. 4 shows a circuit diagram of another switch in accordance with an embodiment of the present invention.

A shifter such as that inserted in the circuit of FIG. 2 is illustrated in greater detail in FIG. 4.

The output U of the shifter LS is connected to the inputs of the inverters P1 and P2. The output of the inverter P2 corresponds to the output of the drive network. The capacitor CE and the diode D1 are connected in series between the output of the inverter P1 and the reference VR. The intermediate tap of this series connection, which corresponds to a node DUP, is connected to the power supply input of the inverter P2.

The shifter LS serves if the levels of the signals available for switch control do not correspond respectively to the reference potentials GND and VR and in particular if the high level is much lower than necessary.

The group consisting of the inverter P1, capacitor CE and diode D1 constitutes a simple voltage booster circuit and in particular a duplicator. The duplicated continuous voltage, which corresponds to approximately double the difference in potential between the references VR and GND, is available at the node DUP. But specifically this is true only when the output signal U is at low level while when the output signal U is at high level the voltage at the node DUP corresponds to the power reference potential VR less the voltage drop at the ends of the diode D1.

By means of this duplicate voltage, having in reality a variable value, the inverter P2 is powered and acts as an output stage. At the output of this inverter there will thus be a logical signal having low level corresponding to the reference potential GND and high level corresponding to the duplicate voltage.

Naturally depending on the levels of the logical input signals the levels required at the logical output signals and the power supply potentials it will be necessary to choose an appropriate topology for the voltage booster circuit from among those known in the prior art.

The shifter LS of FIG. 4 is equipped with two mutually inverted logical inputs I and IN, two mutually inverted logical outputs U and UN and two power supply inputs, one to be connected to the power supply reference VR and the other to be connected to the ground reference GND and comprises two n-channel MOS transistors M5 and M6 and two p-channel MOS transistors M7 and M8. In the case of the circuit of FIG. 2 the output UN is not shown because not used.

The input I is connected to the control terminal of the transistor M5 which has its source and body terminals connected together to the reference GND and its drain terminal connected to the output UN. The input IN is connected to the control terminal of the transistor M6 which has its source and body terminals connected together to the reference GND and its drain terminal connected to the output U. The transistor M7 has it source and body terminals connected together to the reference VR and its drain terminal connected to the drain terminal of the transistor M6. The transistor M8 has its source and body terminals connected together to the reference VR and its drain terminal connected to the drain terminal of the transistor M5. The transistors M7 and M8 also have their respective control terminals cross connected to the drain terminals.

Another switch in accordance with the present invention is shown in FIG. 4.

This switch exhibits two symmetrical branches. The first branch A comprises the series connection between the nodes N1 and N2 of a first transistor M1A, a first reactance network C2A (i.e. a first capacitor in FIG. 4), and a second transistor M2A. The second branch B comprises the series connection between the nodes N1 and N2 of a third transistor M1B, a third reactance network C2B (i.e. a third capacitor in FIG. 4), and a fourth transistor M2B. All the transistors are the MOS type. In the presently preferred embodiment, the two networks C2A and C2B are essentially equal, and the four transistors are driven in such a manner that when the switch is closed the conduction of the two branches is dependent on the polarity of the signal at the ends of the nodes N1 and N2.

Specifically the transistor M1A is p-channel and has its source terminal connected to the node N1 and drain and body terminals connected together to a first terminal T1A of the network C2A, the transistor M2A is n-channel and has its source and body terminals connected together to the node N2 and drain terminal connected to a second terminal T2A of the network C2A, the transistor M2B is p-channel and has its source terminal connected to the node N2 and drain and body terminals connected together to a fourth terminal T2B of the network C2B, and the transistor M1B is n-channel and has its source and body terminals connected together to the node N1 and drain terminal connected to a third terminal T1B of the network C2B.

The connections of the various body terminals as shown are extremely important, and advantageously avoid undesired conduction along the branches of the switch through the parasitic junctions associated with the MOS transistors.

As mentioned above for the switch of FIG. 2, apart from the type of MOS transistors and how they are connected, the switch needs a network which must be powered to drive them.

Such a network can be included in the control circuitry of the switch or in the switch itself. If the control circuitry is included in the second network it is appropriate to power the drive circuitry and the second network by means of the same power reference.

Choice of the channel type of the various MOS transistors adopted in the circuit of FIG. 4 permits avoiding the use of voltage booster circuits in the drive network if it is powered through the power supply reference of the second electrical network.

Again this choice permits connecting together the control terminals of the two p-channel transistors M1A and M2B of the two n-channel transistors M2A and M1B and hence driving them by means of only two logical drive signals. Given the symmetry of the circuit the relationship between the two drive signals is simple. They are mutually reversed.

The drive network can be simply and basically made up of the shifter LS which was described above. In FIG. 4 are also used a third inverter P3 connected to the output UN as an output buffer to drive the control terminals of the p-channel transistors and a fourth inverter P4 connected to the output U as an output buffer to drive the control terminals of the n-channel transistors.

Operation of the circuit is conceptually similar to that of FIG. 2. But an interesting property was found experimentally when the first and the third networks consist of two preferably equal capacitors. The switch effect of the two capacitors is similar to the switching of a single capacitor having capacitance equal to the sum of the two.

Figure 4A:
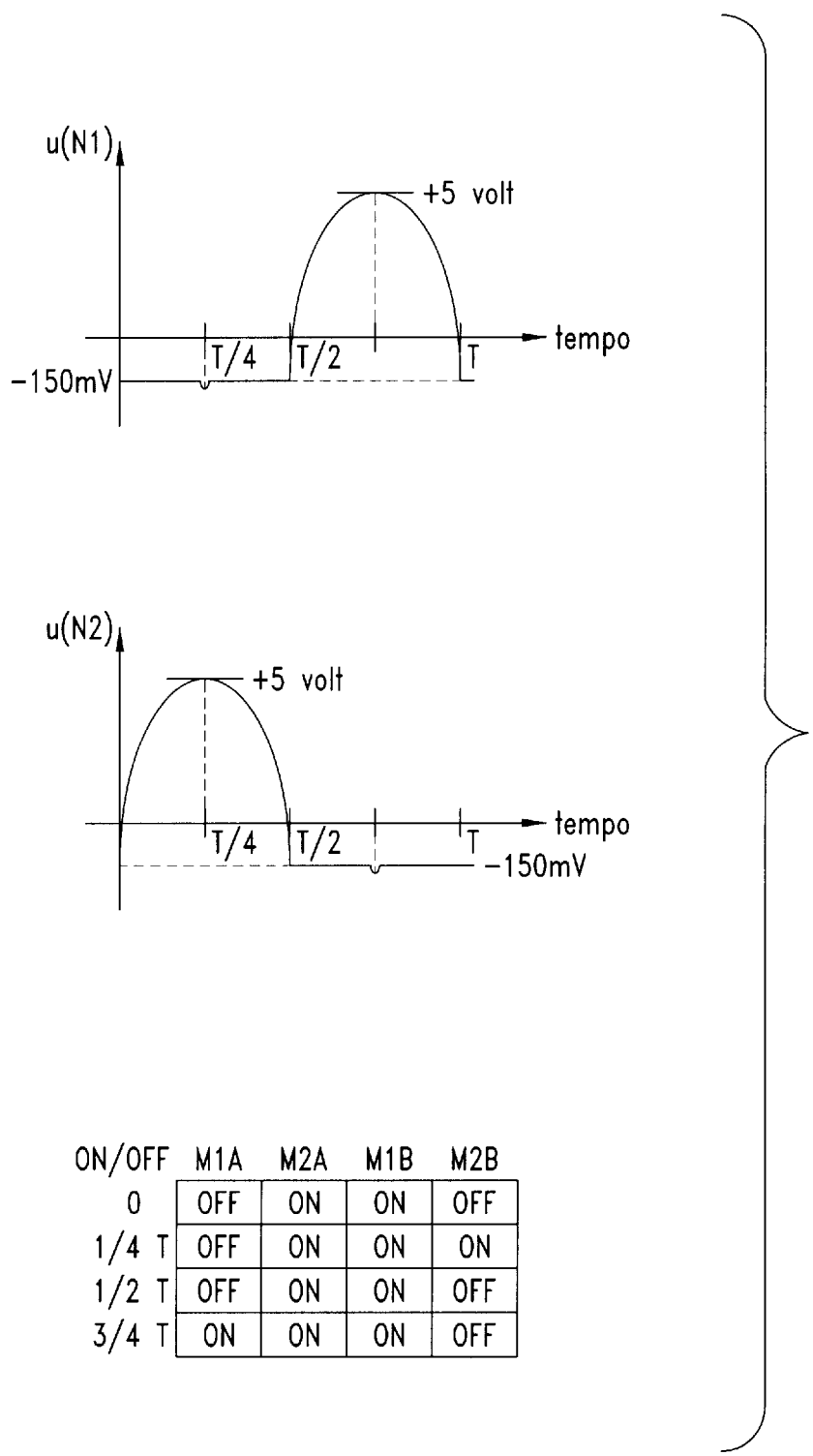
FIGS. 4A–4B show the conduction states of the four FETs on the right side of FIG. 4, at different phases of the resonant frequency oscillation which is seen at nodes N1 and N2.
Figure 4B:
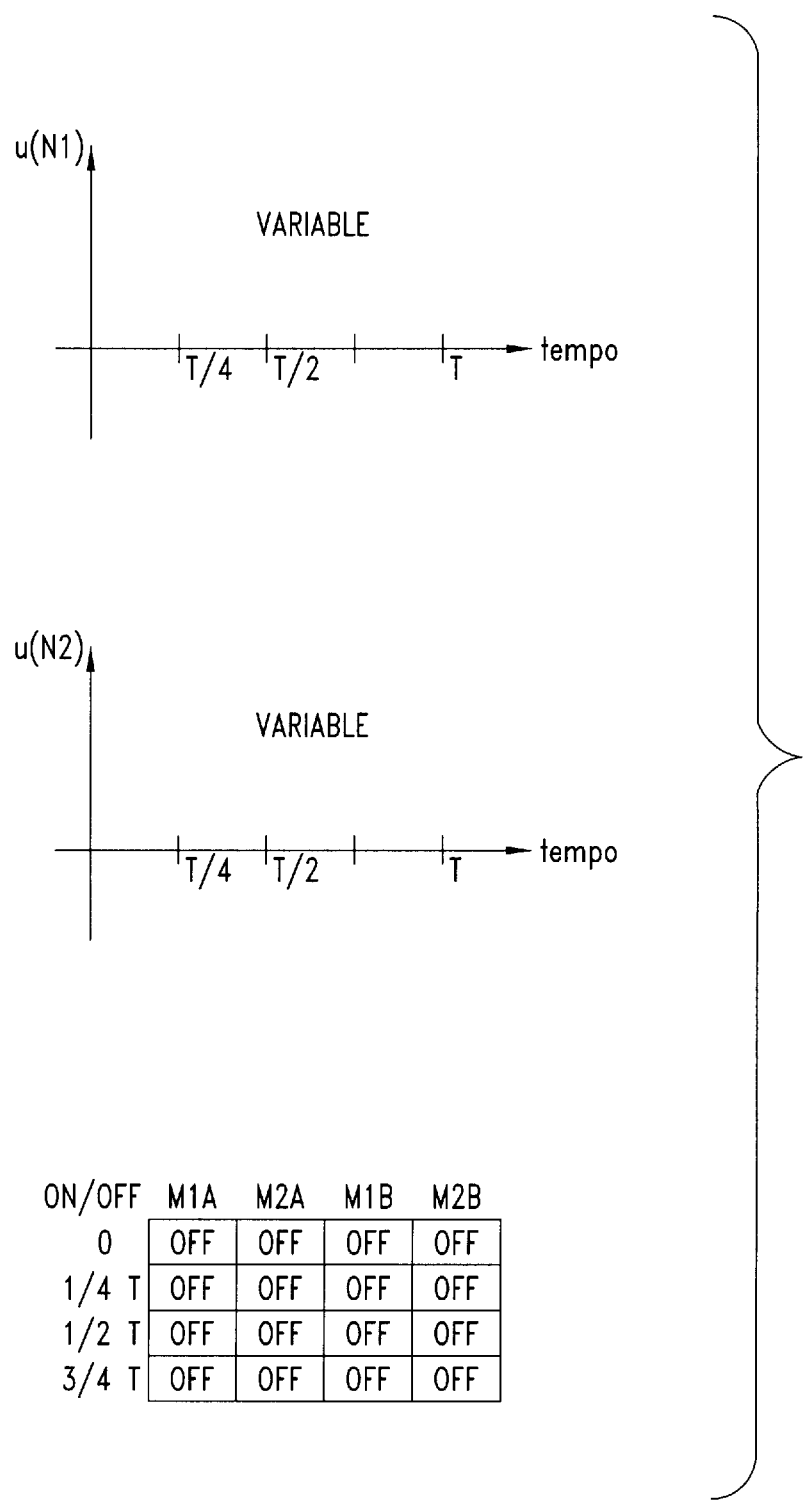

FIGS. 4A–4B show the conduction states of the four FETs on the right side of FIG. 4, at different phases of the resonant oscillation seen at nodes N1 and N2. FIG. 4A shows the case where signal GATEN is at a boosted high voltage (8.6V in this embodiment), and complementary signal GATEP is low (0V). In this case both M1B and M2B will be on simultaneously at time ¼T, and both M1A and M2A will be on at time ¾T. (The two aligned graphs at the top show how the voltages u(N1) and u(N2) of nodes N1 and N2, vary through a cycle of the tank resonant frequency.) FIG. 4B shows the complementary case, where signal GATEP is at the boosted high voltage and GATEN is low; in this case all four transistors stay off throughout the cycle. The specific voltage values are of course highly dependent on the particular circuit implementation, but this analysis does show the details of operation of the switching portion of the circuit of FIG. 4.

Switches such as those described above lend themselves to easy integration. An appropriate choice consists e.g. of connecting the ground reference GND to the substrate of the integrated circuit.

An integrated circuit affected at least by variable polarity signals can include advantageously one or more switches in accordance with the present invention for controlled switching thereof. In addition to the switch the integrated circuit will include generally much other circuitry.

In integrated circuits of this type it is extremely important to identify the node of the circuitry to which to connect the substrate and indeed, since often electronic components must be inserted in process wells distinct and isolated from each other by the "junction isolation" technique, it is essential that the substrate never be at a potential such that one or more of such junctions be in conduction conditions. In the case of a p-doped substrate it would be desirable to connect the substrate to the node of the circuit which takes on the lower potential during operation. In circuits affected by single-polarity signals this would be ground. In the case of variable polarity signals this is generally not true.

Figure 1:
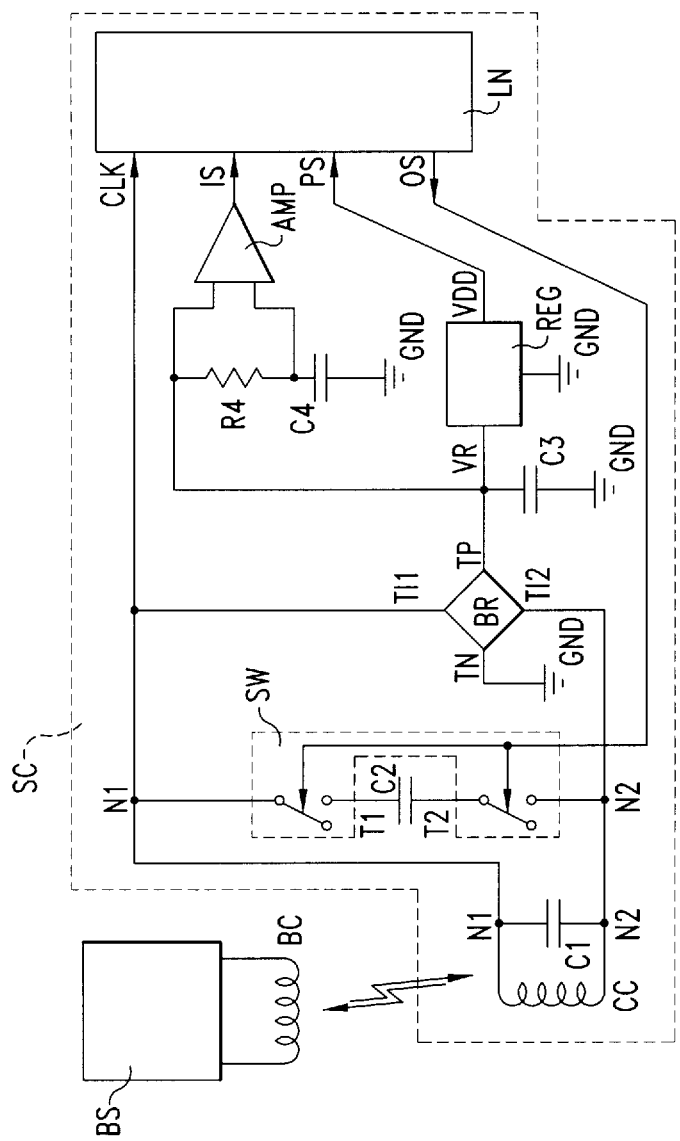
FIG. 1 shows a block diagram of a transmission system comprising an electronic card in accordance with an embodiment of the present invention.

If a bridge rectifier, e.g. such as that indicated by BR in FIG. 1, is integrated in the circuit together with the switch in accordance with the present invention, e.g. such as that indicated by SW in FIG. 1, it can be elected to connect the negative terminal TN of the bridge BR to the substrate.

In order for this to operate it is appropriate that the potential of the terminal TI2 never be less than approximately −700 mV lower than the terminal TN. This result can be achieved thanks to the circuit shown in FIG. 3.

Figure 3:
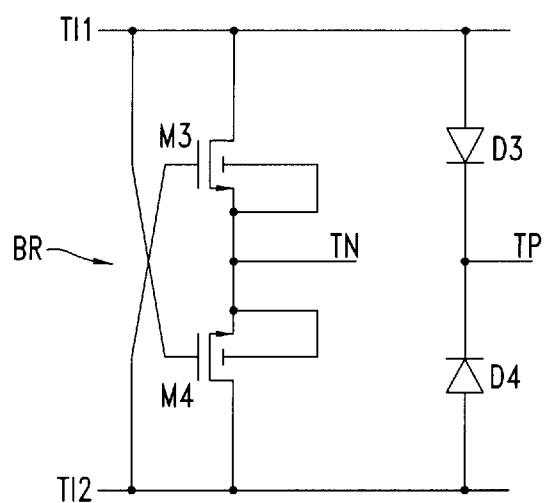
FIG. 3 shows a circuit diagram of a rectifier to be used in combination with a switch in accordance with an embodiment of the present invention.

The bridge rectifier of FIG. 3 is equipped with two indifferent terminals TI1 and TI2, a positive terminal TP and a negative terminal TN, and comprises four branches. The two branches connected to the terminal TN comprise respectively two n-channel MOS transistors M3 and M4. The terminal TN is then used as ground potential reference GND.

In FIG. 3 the transistor M4 is equipped with a source terminal connected to its body terminal and to the terminal TN, a drain terminal connected to the terminal TI2 and a control terminal connected to the terminal TI1. The transistor M3 is equipped with a source terminal connected to its body terminal and to the terminal TN, a drain terminal connected to the terminal TI1 and a control terminal connected to the terminal TI2.

In the circuit of FIG. 3 the other two branches of the rectifier are provided by means of two diodes D3, D4 connected respectively between the terminals TI1, TI2 and TP.

The use of the MOS transistors in place of the conventional diodes permits limiting the voltage drop between the terminal TN and the terminal TI2 to 300 mV or 400 mV provided the transistor M4 is appropriately sized. The maximum voltage drop corresponds to the product of the RDS of the energized transistor M4 and the maximum current supplied by the bridge. The 400 mV or 300 mV missing from the 700 mV constitute a sufficient margin to ensure insulation.

Such a polarity of the substrate also permits correct operation of the switch in accordance with the present invention.

As mentioned above, an application of the present invention is represented by electronic cards.

FIG. 1 shows such an electronic card indicated by SC. The card SC comprises a resonant circuit consisting e.g. of parallel connection of a coil CC and a capacitor C1 between a first node N1 and a second node N2 for reception and/or transmission of signals and an electrical network designed to vary at least one resonance parameter, e.g. resonance frequency or the merit factor of the resonant circuit if coupled thereto.

Variation of the resonance frequency can serve as mentioned above for "transmission" of data to the station BS or reception of data from different stations operating at different frequencies.

Coupling between the resonant circuit and the network can be done advantageously on command through a switch in accordance with the present invention. Indeed, the switch will switch signals received with variable polarity and not readily predictable amplitude, generally a few volts.

In FIG. 1 the electrical network consists simply of a capacitor C2 which is connected on command in parallel with the resonant circuit through the switch SW. Specifically a first terminal T1 of the capacitor C2 is connected to the node N1 while a second terminal T2 of the capacitor C2 is connected to the node N2.

As known, to perform its function the card SC needs other circuitry indicated only schematically in FIG. 1. The heart of the card SC consists of the logical network LN which is as known generally made up essentially of a processor and RAM and/or ROM and/or EEPROM and/or FLASH memories.

The network LN generally receives at input at least one clock signal CLK and a power signal PS. It can then further receive an input data signal IS and/or generate a data output signal OS. These signals are generated by additional circuitry present in the card. Normally this circuitry comprises at least one rectifier BR, e.g. like that of FIG. 3 which operates well in combination with the switch of FIG. 2.

The terminals TI1 and TI2 are connected in parallel with the resonant circuit. The terminal TN of the rectifier BR operates as ground potential reference GND while the terminal TP of the rectifier BR can operate as potential reference VR. In reality it is appropriate to use, as shown in FIG. 1, a capacitor C3 downstream of the rectifier BR in order that the potential reference VR be sufficiently steady in time. For reliable operation of the logical network LN however a steady power supply potential reference not dependent upon the amplitude of the signal at the ends of the resonant circuit is necessary. For this purpose, in FIG. 1 is provided a regulator REG hooked to ground GND, powered by the reference VR and having an output operating as power supply potential reference VDD.

The group consisting of the rectifier BR and the capacitor C3 constitutes an unstabilized power supply while the group consisting of the rectifier BR, the capacitor C3 and the regulator REG constitutes a stabilized power supply.

As seen, even the switch SW needs power supply and this can be taken advantageously from one of these feeders. Despite the fact that the potential VR is unstabilized, the fact that it is higher—sometimes much higher—than the potential VDD makes it preferable as a power source. Just because of the unpredictability of the value of the potential VR it is advantageous to connect, e.g. in parallel with the capacitor C3 a voltage limiting circuit, termed "clamp", not shown in FIG. 1. This circuit could advantageously be made up of an npn bipolar transistor having a resistor connected between its base and its emitter and having the series connection of a Zener diode and an npn bipolar transistor diode-connected between the collector and its base. Such a circuit has the advantage of having a limit value independent of the current flowing in the bridge BR.

As mentioned above the circuits of FIG. 2 and FIG. 4 lend themselves particularly well to use in an electronic card. Indeed, the data signal OS generated by the logical network LN is a logical signal having logical levels linked to the potentials of the references VDD and GND. The shifter LS powered by the reference VR permits obtaining a logical signal having logical levels linked to the amplitude of the oscillations present in the resonant circuit. This is sufficient to drive as desired the transistors of the switch of FIG. 4. For the circuit of FIG. 2 the voltage duplicator in combination with the output inverter completes raising of the high logic level.

In this manner the signal OS can be sent directly to the switch SW to obtain when desired the transmission effect.

The signal CLK can be taken from the potential present at the terminal TI1 of the rectifier BR.

The signal IS can be taken from the potential at the terminal TP of the rectifier BR through a peak detector. This detector can consist e.g. of the series connection between the terminal TP and the reference GND of a resistor R4 and a capacitor C4 and a differential amplifier AMP having its input connected to the ends of the resistor R4 and its output connected to the output of the peak detector.

It would be advantageous to be able to integrate all the circuitry of the card SC in a single integrated circuit or at least in a few integrated circuits. The greatest difficulties of integration consist of the capacitors C1, C2, C3 but especially the coil CC. If at least the switch SW and the rectifier BR are integrated on the same integrated circuit it is appropriate, as mentioned above, to connect the terminal TN to its substrate which then acts as ground potential reference GND for the rest of the circuitry of the card SC.

According to one disclosed innovative embodiment, there is provided: an electrically controlled switch of the type designed for coupling first and second terminals of a first electrical network and in particular a two-terminal circuit element respectively to a first and a second node of a second electrical network and comprising a first and a second MOS transistor having main conduction paths respectively coupled between said first terminal and said first node and between said second terminal and said second node.

According to another disclosed innovative embodiment, there is also provided that said first and second transistors have a channel of the same type of conductivity and in particular N conductivity and have their control terminals coupled together.

According to another disclosed innovative embodiment, there is also provided that the switch further comprises a drive network designed to drive the control terminals of said first and second transistors and powered in particular by the power supply reference of said first and/or second electrical network.

According to another disclosed innovative embodiment, there is also provided that said drive network comprises a voltage booster circuit designed to power at least its output stage.

According to another disclosed innovative embodiment, there is also provided that the switch comprises in addition to said first and second transistors a third and a fourth MOS transistors having main conduction paths respectively coupled between a third terminal of a third electrical network essentially equal to said first electrical network and said first node and between a fourth terminal of said third electrical network and said second node.

According to another disclosed innovative embodiment, there is also provided that said first and fourth transistors are p-channel and have their control terminals coupled together and said second and third transistors are n-channel and have their control terminals coupled together.

According to another disclosed innovative embodiment, there is also provided that the switch comprises additionally a drive network designed to drive the control terminals of said first, second, third and fourth transistors and powered in particular by the power supply reference of said second electrical network.

According to another disclosed innovative embodiment, there is also provided that the switch comprises additionally a drive network designed to drive the control terminals of said first, second, third and fourth transistors and powered in particular by the power supply reference of said second electrical network.

According to another disclosed innovative embodiment, there is also provided that said drive network generates two mutually inverted drive signals.

According to another disclosed innovative embodiment, there is also provided that said transistors are connected in such a manner as to not allow conduction in said first network and/or third network through their parasitic junction.

According to another disclosed innovative embodiment, there is also provided: an integrated circuit of the type affected at least by variable polarity signals comprising at least a switch as disclosed for the controlled switching of said signals.

According to another disclosed innovative embodiment, there is also provided: an electronic card of the type comprising a resonant circuit for the reception and/or transmission of signals and a first electrical network designed to change at least one resonance parameter of said resonant circuit if coupled thereto and characterized in that it comprises at least one switch in accordance with one of claims 1 to 9 and connected in such a manner as to provide said coupling on command.

According to another disclosed innovative embodiment, there is also provided: A smart card operable in a purely wireless mode, comprising: an RF antenna and tank circuit having a first resonant frequency; a power supply circuit connected to draw power from the tank circuit, and to provide a power supply voltage therefrom; a tank-switching circuit, comprising an additional reactance having at least first and second nodes, first and second field-effect transistors each interposed between a respective one of the nodes and the tank circuit, and control circuitry connected to turn the first and second transistors both on or both off; whereby, when the transistors are both on, the tank-switching circuit shifts the resonant frequency of the tank circuit to a second resonant frequency which is different from the first resonant frequency.

According to another disclosed innovative embodiment, there is also provided: A smart card operable in a purely wireless mode, comprising: an RF antenna and tank circuit having a first resonant frequency; a power supply circuit connected to draw power from the tank circuit, and to provide a power supply voltage therefrom; a voltage-boosting circuit connected to draw power from the power supply voltage, and to provide a boosted voltage therefrom; a tank-switching circuit, comprising an additional reactance having at least first and second nodes, first and second field-effect transistors of a common conductivity type, each interposed between a respective one of the nodes and the tank circuit, and control circuitry, powered from the boosted voltage, and connected to turn the first and second transistors both on or both off; whereby, when the transistors are both on, the tank-switching circuit shifts the resonant frequency of the tank circuit to a second resonant frequency which is different from the first resonant frequency.

According to another disclosed innovative embodiment, there is also provided: A smart card operable in a purely wireless mode, comprising: an RF antenna and tank circuit having a first resonant frequency; a power supply circuit connected to draw power from the tank circuit, and to provide a power supply voltage therefrom; a tank-switching circuit, comprising at least one additional reactance having at least first and second nodes, first and second field-effect transistors of a common conductivity type, each interposed between a respective one of the nodes and the tank circuit, and control circuitry, powered from the power supply voltage, and connected, through a level-shifting stage, to turn the first and second transistors both on or both off; whereby, when the transistors are both on, the tank-switching circuit shifts the resonant frequency of the tank circuit to a second resonant frequency which is different from the first resonant frequency.

According to another disclosed innovative embodiment, there is also provided: A smart card operable in a purely wireless mode, comprising: an RF antenna and tank circuit having a first resonant frequency; a power supply circuit connected to draw power from the tank circuit, and to provide a power supply voltage therefrom; a tank-switching circuit, comprising: a first additional reactance, having a first node thereof connected through a first field-effect transistor of a first conductivity type to a first node of the tank circuit, and a second node thereof connected through a second field-effect transistor of a second conductivity type to a second node of the tank circuit; and a second additional reactance, having a first node thereof connected through a third field-effect transistor of the second conductivity type to a first node of the tank circuit, and a second node thereof connected through a fourth field-effect transistor of the first conductivity type to a second node of the tank circuit; and control circuitry connected, through a level-shifting stage, to selectably turn the first through fourth transistors all on during part of a cycle of the first resonant frequency; whereby, when the transistors are all on, the tank-switching circuit shifts the resonant frequency of the tank circuit to a second resonant frequency which is different from the first resonant frequency.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A smart card operable in a purely wireless mode, comprising:

an RF antenna and a tank circuit having a first resonant frequency;

a power supply circuit connected to draw power from said tank circuit, and to provide a power supply voltage therefrom; and a tank-switching circuit, comprising:
an additional reactance having at least first and second nodes,
first and second field-effect transistors each interposed between a respective one of said nodes and said tank circuit, and
control circuitry connected to turn said first and second transistors both on or both off;

wherein, when said first and second transistors are both on, said tank-switching circuit is structured to shift the first resonant frequency of said RF antenna and said tank circuit to a second resonant frequency which is different from the first resonant frequency.

2. The smart card of claim 1 wherein said power supply circuit comprises a bridge rectifier followed by a capacitor.

3. The smart card of claim 1 wherein said additional reactance comprises a single capacitor.

4. The smart card of claim 1 wherein said RF antenna and said tank circuit comprise an inductance shunted by a capacitor.

5. A smart card operable in a purely wireless mode, comprising:
an RF antenna and a tank circuit having a first resonant frequency;
a power supply circuit connected to draw power from said tank circuit, and to provide a power supply voltage therefrom;
a voltage-boosting circuit connected to draw power from said power supply voltage, and to provide a boosted voltage therefrom; and
a tank-switching circuit, comprising:
an additional reactance having at least first and second nodes,
first and second field-effect transistors of a common conductivity type, each interposed between a respective one of said nodes and said tank circuit, and
control circuitry, powered from said voltage-boosting circuit, and connected to turn said first and second transistors both on or both off;
wherein, when said first and second transistors are both on, said tank-switching circuit is structured to shift the first resonant frequency of said RF antenna and said tank circuit to a second resonant frequency which is different from the first resonant frequency.

6. The smart card of claim 5 wherein said power supply circuit comprises a bridge rectifier followed by a capacitor.

7. The smart card of claim 5 wherein said additional reactance comprises a single capacitor.

8. The smart card of claim 5 wherein said RF antenna and said tank circuit comprise an inductance shunted by a capacitor.

9. A smart card operable in a purely wireless mode, comprising:
an RF antenna and a tank circuit having a first resonant frequency;
a power supply circuit connected to draw power from said tank circuit, and to provide a power supply voltage therefrom; and
a tank-switching circuit, comprising
at least one additional reactance having at least first and second nodes;
first and second field-effect transistors of a common conductivity type, each interposed between a respective one of said nodes and said tank circuit; and
control circuitry, powered from said power supply voltage, and connected, through a level-shifting stage, to turn said first and second transistors both on or both off; and
wherein, when said first and second transistors are both on, said tank-switching circuit is structured to shift the first resonant frequency of said RF antenna and said tank circuit to a second resonant frequency which is different from the first resonant frequency.

10. The smart card of claim 9 wherein said power supply circuit comprises a bridge rectifier followed by a capacitor.

11. The smart card of claim 9 wherein said additional reactance comprises a single capacitor.

12. The smart card of claim 9 wherein said RF antenna and said tank circuit comprise an inductance shunted by a capacitor.

13. A smart card operable in a purely wireless mode, comprising:
an RF antenna and a tank circuit having a first resonant frequency;
a power supply circuit connected to draw power from said tank circuit, and to provide a power supply voltage therefrom; and
a tank-switching circuit, comprising:
a first additional reactance, having a first node thereof connected through a first field-effect transistor of a first conductivity type to a first node of said tank circuit, and a second node thereof connected through a second field-effect transistor of a second conductivity type to a second node of said tank circuit; and
a second additional reactance, having a first node thereof connected through a third field-effect transistor of said second conductivity type to the first node of said tank circuit, and a second node thereof connected through a fourth field-effect transistor of said first conductivity type to the second node of said tank circuit; and
control circuitry connected, through a level-shifting stage, to selectably turn said first, second, third, and fourth transistors on during part of a cycle of said first resonant frequency; and
wherein, when said first second, third, and fourth transistors are on, said tank-switching circuit is structured to shift the first resonant frequency of said RF antenna and said tank circuit to a second resonant frequency which is different from the first resonant frequency.

14. The smart card of claim 13 wherein said power supply circuit comprises a bridge rectifier followed by a capacitor.

15. The smart card of claim 13 wherein said first additional reactance and said second additional reactance each comprise a single capacitor.

16. The smart card of claim 13 wherein said RF antenna and said tank circuit comprise an inductance shunted by a capacitor.

17. A circuit comprising:
a receiver circuit connected between a first node and a second node and being structured to receive a signal having a variable polarity between the first node and the second node; and
an electrically controlled switch structured to couple a first terminal and a second terminal of a first circuit element respectively to said first node and said second node of the receiver circuit, the switch comprising a first MOS transistor and a second MOS transistor having main conduction paths respectively coupled between said first terminal and said first node and between said second terminal and said second node to couple the circuit element to receive the signal.

18. The circuit of claim 17 wherein said first and second transistors each have a channel of an N-type of conductivity and have control terminals coupled together.

19. The circuit of claim 17, further comprising a drive network coupled to drive control terminals of said first and second transistors and powered in particular by a power supply reference of one or both of said first circuit element and said receiver circuit, said receiver circuit comprising an antenna.

20. The circuit of claim 19 wherein said drive network comprises a voltage booster circuit structured to power at least an output stage of the drive network.

21. The circuit of claim 17, further comprising a third MOS transistor and a fourth MOS transistor each having main conduction paths respectively coupled between a first terminal of a second circuit element similar to said first circuit element and said first node and between a second terminal of said second circuit element and said second node; and wherein said receiver circuit comprises an antenna.

22. The circuit of claim 21, further comprising a drive network coupled to drive control terminals of said first, second, third and fourth transistors and powered in particular by a power supply reference coupled to said antenna.

23. The circuit of claim 22 wherein said drive network is structured to generate two mutually inverted drive signals.

24. The circuit of claim 21 wherein said first and second transistors are connected in such a manner as to prevent conduction in one or both of said first circuit element and said second circuit element through a parasitic junction in an integrated circuit including the switch.

25. The circuit of claim 21 wherein said first and fourth transistors are p-channel MOS transistors and have control terminals coupled together and said second and third transistors are n-channel MOS transistors and have control terminals coupled together.

26. The circuit of claim 25, further comprising a drive network coupled to drive the control terminals of said first, second, third and fourth transistors and powered in particular by a power supply reference coupled to said antenna.

27. The circuit of claim 17 wherein the switch is structured to couple the first and second terminals of the first circuit element respectively to the first and second nodes that are coupled to receive said variable polarity signal through the receiver circuit, the switch comprising a portion of an integrated circuit.

28. An integrated circuit having a substrate and comprising:
- a receiver circuit connected between a first node and a second node and being structured to receive a signal having a variable polarity between the first node and the second node;
- an electrically controlled switch structured to couple a first terminal and a second terminal of a circuit element respectively to the first node and the second node of the receiver circuit, the switch comprising a first MOS transistor and a second MOS transistor having main conduction paths respectively coupled between said first terminal and said first node and between said second terminal and said second node; and
- a bridge rectifier having first and second indifferent terminals, a positive terminal and a negative terminal, each of the first and second indifferent terminals being coupled to the negative terminal through a respective MOS transistor, said first and second indifferent terminals being coupled respectively to said first and second nodes and said negative terminal being coupled to the substrate.

29. An electronic card comprising:
- a resonant circuit for a reception and/or a transmission of signals;
- a first electrical network structure to change at least one resonance parameter of said resonant circuit if coupled thereto; and
- at least one switch structured to couple first and second terminals of the first electrical network respectively to a first node and a second node of the resonant circuit, the switch comprising a first MOS transistor and a second MOS transistor having main conduction paths respectively coupled between said first terminal and said first node and between said second terminal and said second node, the switch being structured in such a manner as to provide said coupling based on a command.

30. The electronic card of claim 29 wherein said first electrical network comprises a first capacitor and said resonant circuit comprises a parallel connection between the first node and the second node of a second capacitor and an inductor.

31. The electronic card of claim 29 wherein said switch is coupled to receive power from a power supply circuit coupled in parallel with said resonant circuit.

32. The electronic card of claim 31 wherein at least said switch and said power supply circuit comprise a portion of an integrated circuit having a substrate and said power supply circuit comprises a bridge rectifier having first and second indifferent terminals, a positive terminal and a negative terminal, each of the first and second indifferent terminals being coupled to the negative terminal through a respective MOS transistor, said first and second indifferent terminals being coupled respectively to said first and second nodes and said negative terminal being coupled to the substrate of said integrated circuit.

33. An integrated circuit in a substrate comprising:
- an input antenna having first and second input nodes and structured to receive variable polarity signals;
- a first MOS transistor having a main conduction path coupled between said first input node and a first output node;
- a second MOS transistor having a main conduction path coupled between said second input node and a second output node; and
- a two-terminal circuit element connected between said first and second output nodes and being structured to be coupled to the input antenna through the first and second MOS transistors.

34. The integrated circuit of claim 33, further comprising a bridge rectifier having first and second indifferent terminals, a positive terminal and a negative terminal, each of the first and second indifferent terminals being coupled to the negative terminal through a respective MOS transistor, said first and second indifferent terminals being coupled respectively to said first and second nodes and said negative terminal being coupled to the substrate.

* * * * *

UNITED STATES PATENT AND TRADEMARK OFFICE
CERTIFICATE OF CORRECTION

PATENT NO. : 5,854,481
DATED : December 29, 1998
INVENTOR(S) : Giulio Ricotti et al.

It is certified that error appears in the above-identified patent and that said Letters Patent is hereby corrected as shown below:

On the cover page, the application number is incorrect

On the cover page, item [21], after "No.:" delete "688,830" and insert therefor "08/688,830"

Signed and Sealed this

Twenty-first Day of November, 2000

Attest:

Q. TODD DICKINSON

*Attesting Officer*      *Director of Patents and Trademarks*